(12) United States Patent
Chen

(10) Patent No.: US 6,243,509 B1
(45) Date of Patent: Jun. 5, 2001

(54) PACKAGING ENHANCED BOARD LEVEL OPTO-ELECTRONIC INTERCONNECTS

(75) Inventor: Ray T. Chen, Austin, TX (US)

(73) Assignee: Board of Regents - The University of Texas System, Austin, TX (US)

( * ) Notice: Subject to any disclaimer, the term of this patent is extended or adjusted under 35 U.S.C. 154(b) by 0 days.

(21) Appl. No.: 09/645,387

(22) Filed: Aug. 24, 2000

Related U.S. Application Data

(60) Provisional application No. 60/150,992, filed on Aug. 27, 1999.

(51) Int. Cl.$^7$ ........................................................ G02B 6/12
(52) U.S. Cl. ............................. 385/14; 385/88; 385/89; 385/129; 385/130; 385/131
(58) Field of Search ................................. 385/14, 15, 16, 385/129, 130, 131, 88, 89, 141

(56) References Cited

U.S. PATENT DOCUMENTS

| | | | |
|---|---|---|---|
| 4,732,446 | * | 3/1988 | Gipson et al. ...................... 385/14 X |
| 4,772,787 | * | 9/1988 | Trommer ............................. 385/14 X |
| 4,966,430 | * | 10/1990 | Weidel ................................. 385/14 X |
| 5,170,448 | * | 12/1992 | Ackley et al. ........................ 385/31 |
| 5,357,122 | * | 10/1994 | Okubora et al. .................... 385/14 X |
| 5,400,419 | * | 3/1995 | Heinen ................................. 385/14 |

* cited by examiner

Primary Examiner—Brian Healy
(74) Attorney, Agent, or Firm—Gardere Wynne Sewell LLP; Sanford E. Warren, Jr.; Edwin S. Flores

(57) ABSTRACT

A planarized signal communications system (110) embedded within a printed circuit board (102) is disclosed, comprising first (118) and second (120) index buffer layers within the printed circuit board, a polymer waveguide (116) disposed below the first and above the second index buffer layers, an electrical-to-optical transmitter (122) disposed within the first index buffer layer in direct adjoinment with the polymer waveguide, a reflective element (126) disposed within the polymer waveguide in direct alignment with the electrical-to-optical transmitter and adapted to reflect optical energy from the electrical-to-optical transmitter along the polymer waveguide, an optical-to-electrical receiver (124) disposed within the first index buffer layer and in direct adjoinment with the polymer waveguide, a reflective element (126) disposed within the polymer waveguide in direct alignment with the optical-to-electrical receiver and adapted to reflect optical energy from within the polymer waveguide to the optical-to-electrical receiver, and an at least partially metal layer (128) within the printed circuit board fabricated to provide electrical coupling between the electrical-to-optical transmitter and a surface (108) of the printed circuit board and between the optical-to-electrical receiver and the surface of the printed circuit board.

41 Claims, 1 Drawing Sheet

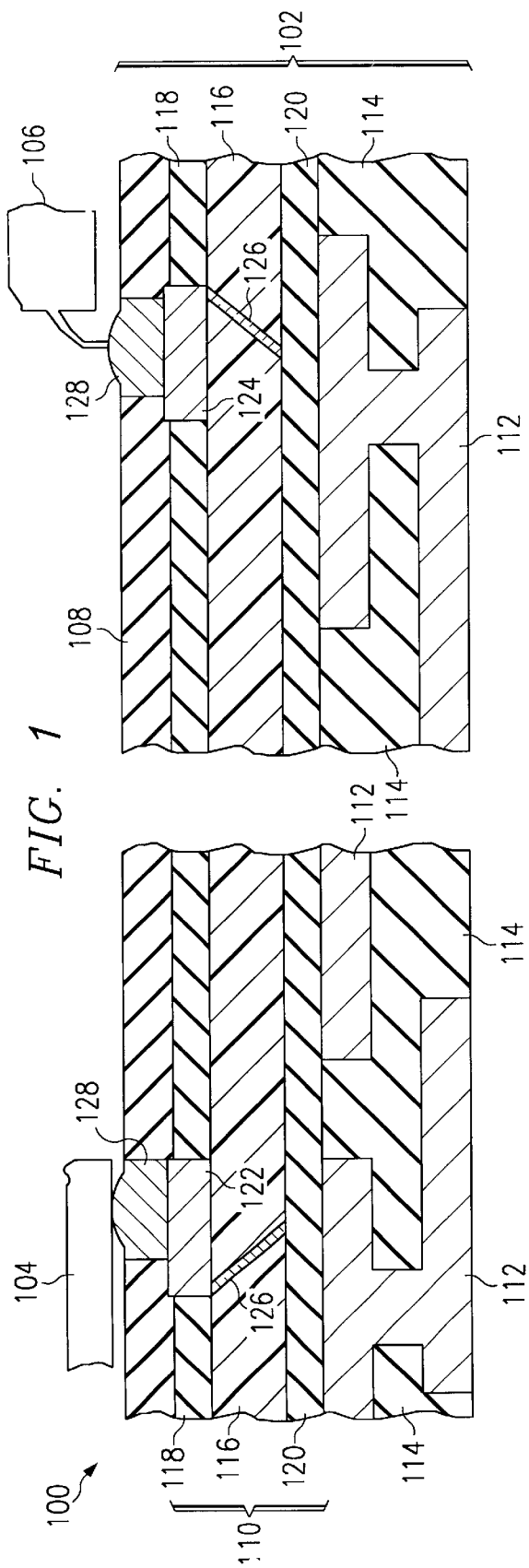
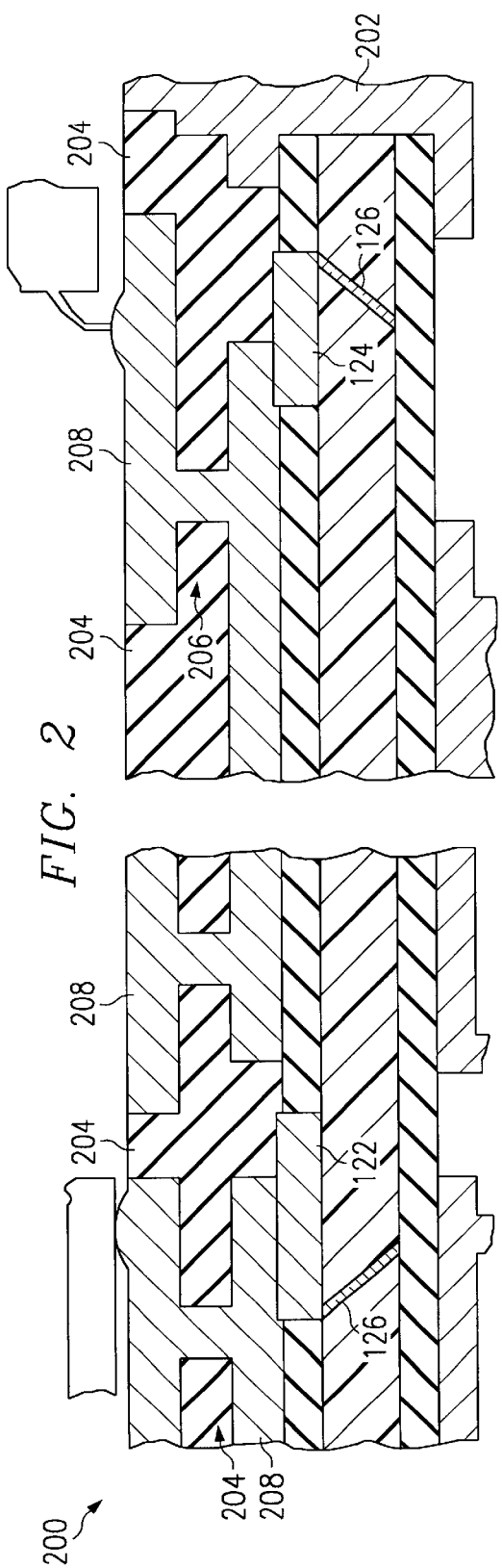

PACKAGING ENHANCED BOARD LEVEL OPTO-ELECTRONIC INTERCONNECTS

This application claims the benefit of Provisional No. 60/150,992 filed Aug. 27, 1999.

TECHNICAL FIELD OF THE INVENTION

The present invention relates, in general, to opto-electronic systems, and in particular, to a system providing opto-electronic signal communications fully embedded within a PC board.

BACKGROUND OF THE INVENTION

Printed circuit boards (PCBs), multi-chip modules (MCMs), and similar structures comprising multiple integrated circuits mounted upon their surfaces are used extensively in modern electronic devices and systems. PCBs typically contain multiple conductive and dielectric layers interposed upon each other, and interlayer conductive paths, referred to as vias, which may extend from an integrated circuit mounted on a surface of the PCB to one or more conductive layers embedded within the PCB. MCMs and other similar structures typically have similar configuration and structure (e.g. a substrate comprising dielectric and conductive layers having inter-layer vias). For ease of reference, all such structures shall hereafter be referred to as "boards".

The speed and complexity of integrated circuits are increased rapidly as integrated circuit technology advances from very large scale integrated (VLSI) circuits to ultra large scale integrated (ULSI) circuits. As the number of components per chip, the number of chips per board, the modulation speed and the degree of integration continue to increase, electrical interconnects are facing fundamental limitations in areas such as speed, packaging, fan-out, and power dissipation. Multi-chip module (MCM) technology has been employed to provide higher clock speeds and circuit density. However, conventional technologies based on electrical interconnects fail to provide requisite multi-Gbits/sec clock speed in intra-MCM and inter-MCM applications.

Additionally, a printed circuit board may, in some instances, be quite large and the conductive paths therein can be several centimeters in length. As conductive path lengths increase, impedances associated with those paths also increase. This has a detrimental effect on the ability of the system to transmit high speed signals. It is therefore desirable that impedances of conductive paths be minimized; in order to, for example, transmit high speed signals in the 1 Gb/sec range.

For these reasons, a conductive layer having relatively high impedance can be replaced by an optical waveguide, which can transmit signals at the speed of light. Waveguides are particularly beneficial when transmitting high speed signals over relatively long distances, as signal loss is minimized.

While embedded waveguides may be formed in a board or semiconductor substrate, difficulties arise when converting electrical signals emanating from an integrated circuit, mounted on the board's surface, to optical signals within the embedded waveguide. Some conventional conversion schemes employ light emitting lasers as transmitters and photo-detectors as receivers, mounted on the upper surface of a board adjacent bonding pads/sockets, which receive integrated circuit pins. The electrical signal from an output pin of an integrated circuit is transmitted, via a conductor at or above the board's surface, to the light emanating laser; which then converts the electrical signal to optical energy. That optical energy permeates from the board surface, through several layers of the board, downward to a waveguide embedded within the board. A grating coupler is typically placed within the waveguide to receive the optical energy and directionally transmit an appropriate wave through the waveguide; eventually to be received by an optical receiver distally located from the grating. An optical receiver can be placed proximate to another integrated circuit, separate from the integrated circuit initiating the transmitted optical signal. The optical receiver can then receive the optical energy, converting it to an electrical signal to be transmitted to an input pin of the receiving integrated circuit.

Thus, using an optical waveguide enhances the speed at which signals can be transmitted between integrated circuits. However, inefficiencies in transmitting optical energy through several layers of conductive and non-conductive materials within a board limit the light-to-electrical and electrical-to-light (opto-electronic) coupling efficiency; thereby limiting high-speed signal transmission within a system.

Additionally, conventional opto-electronic interconnect systems are typically incompatible with commercial manufacturing processes utilizing boards. Consider, for example, a printed circuit board used as a motherboard within a personal computer. A motherboard manufacturer will typically, if not exclusively, use automated equipment and processes to mount desired semiconductor devices on the surface of a printed circuit board. Opto-electronic devices often require care in handling and processing that standard semiconductor devices do not. Therefore, use of conventional opto-electronic interconnect systems will either require modification of standard manufacturing processes or additional processing steps to account for the presence or addition of opto-electronic components on the board surface. Additional monetary and time costs resulting from use of conventional opto-electronic interconnect systems thus render these approaches commercially unviable.

Therefore, a system providing opto-electronic signal communications fully embedded and planarized within a printed circuit board or substrate is now needed; providing opto-electronic interconnection and bus structures compatible with existing surface mount and board production technologies, and providing enhanced opto-electronic coupling efficiency enabling high system operational speeds, while overcoming the aforementioned limitations of conventional methods.

SUMMARY OF THE INVENTION

In the present invention, a printed circuit board or layered substrate is manufactured incorporating a planarized signal communications system therein. Opto-electronic interconnection and bus structures provided herein obviate previously required alterations of surface mount and board production processes to account for the presence of the opto-electronic components. Enhanced opto-electronic coupling efficiency of the present board level waveguide further enables high system operational speeds.

In one embodiment of the present invention, an opto-electronic transmit laser and receive diode are manufactured within a board, instead of disposing them on the upper surface of the board after its fabrication.

In a preferred embodiment of the present invention, a vertical cavity surface emitting laser (VCSEL) is manufactured within a board, directly adjoining a waveguide channel. The laser is coupled to receive an electrical signal forwarded across a via that extends downward from the surface of the board, at which an integrated circuit pin is connected. Thus, the via is interposed between a surface mounted integrated circuit and the fully embedded light emitting laser. The laser then receives electrical energy from the via and converts that electrical energy to optical energy, directing that optical energy into the waveguide. A photo-detector is spaced distally from the light emitting laser to receive the optical energy. The photo-detector, similar to the laser, is manufactured within the board and adjoins the waveguide to receive the optical energy wave directly at its source. The photo-detector then converts the optical wave to an electrical signal; which is transmitted by a via extending from the photo-detector to a surface of the board at which another integrated circuit (receiving integrated circuit) is coupled.

The present invention provides the laser transmitter and photo-detector receiver within the waveguide path, instead of on the surface of a board, providing enhanced opto-electronic coupling and obviating laser tuning needed to permeate the board. By the present invention, the laser and photo-detector may be incorporated within a board manufacturing process.

In one embodiment of the present invention, a thin film silicon based laser and photo-detector are formed at localized transmit and receive positions as the waveguide is formed. Accordingly, the present opto-electronic interconnect system maintains a planar configuration, using a relatively thin laser and photo-detector substrate, and alleviating ambient noise normally occurring external to the board. By thus embedding the sensitive transmit and receive opto-electronic devices, a higher signal-to-noise component can be realized.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 1 is a schematic illustrating one embodiment of a opto-electronic interconnect system according to the present invention;

FIG. 2 is a schematic illustrating an alternative embodiment of an opto-electronic interconnect system according to the present invention.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Convention electrical interconnections are faced with serious bottlenecks in transmitting high speed signals between, for example, processor to memory devices. Efficient implementation of optical interconnects is essential to continued performance advancement of high-speed signal processing applications. Some existing designs implement optical interconnections; however, inefficient interfaces between optical-to-electrical and electrical-to-optical conversion components diminish the effectiveness of high performance micro electronic systems using such interconnections.

The present invention defines a fully embedded transmitter and receiver at the board or substrate level; in one embodiment using thin film based (approximately 10 microns in thickness) vertical cavity surface emitting lasers and silicon photo-detectors in a printed circuit board. By the present invention, integration of integrated circuits on top of a printed circuit board involves purely electronic devices; without any modification or alteration required to account for the optical/electronic interface involved. Thus, only electrical signals are present at a board's surface and packaging and processing problems associated with opto-electronics are overcome. Hundreds of megahertz or even a few gigahertz signals can be successfully transmitted and received in a cost effective manner. The present invention provides integration of optical components compatible with standard printed circuit board fabrication processes, such that higher performance and cost-effectiveness are jointly realized.

Referring now to FIG. 1, one embodiment of an opto-electronic signal communications system 100 according to the present invention is shown in a cross-sectional view. System 100 comprises a multi-layer printed circuit board 102 having semiconductor devices 104 and 106 mounted on its upper surface 108. A planar, opto-electrical communications system 110 is embedded within the board 102, integrated amongst various metallization 112 and dielectric 114 layers.

System 110 comprises a polymer waveguide 116 interposed between upper 118 and lower 120 index buffer layers. Formed within upper buffer layer 118 is electrical-to-optical transmission element 122 and optical-to-electrical receiving element 124. Transmission element 122 is formed directly adjoining (i.e. in direct surface to surface adherence with) waveguide 116, allowing optical energy to be generated directly into waveguide 116 by element 122. Similarly receiving element 124 is formed directly adjoining waveguide 116, allowing optical energy to be drawn directly from waveguide 116 by element 124. Reflective elements 126 are formed within waveguide 116 in alignment with elements 122 and 124, to provide direction of transmitted optical energy. The present invention thus provides highly efficient opto-electronic coupling.

In a preferred embodiment, transmission element 122 comprises a vertical cavity surface emitting laser (VCSEL). Depending on desired wavelength, accuracy, and other design considerations, other suitable electrical-to-optical conversion devices, such as edge emitting lasers, may be employed. Using VCSELs, however, modulation bandwidth as high as 6 GHZ. may be realized at a wavelength of 850 nm. Additionally, such a wavelength is compatible with silicon based photo-detectors. Transmission element 122 may be fabricated using thin-film processes known in the art (e.g. epitaxial lift off). Most importantly, element 122 is fabricated using processes compatible with those used to fabricate board 102, as board 102 is being fabricated.

Also in a preferred embodiment, receiving element 124 comprises a silicon-based photo-detector. As such, element 124 may be fabricated by a silicon metal-semiconductor-metal (MSM) process. Again, depending on desired performance characteristics and production parameters, other suitable optical-to-electrical conversion devices may be used.

Element 124 is fabricated using processes compatible with those used to fabricate board 102.

In a preferred embodiment, waveguide 116 is a polyimide-based waveguide. Such a polyimide waveguide may be fabricated on different substrates such as PC board silicon, glass, and others by spin coating. For example, an A-600 primer layer may be spin coated first on a substrate with a spin speed of 5000 rpm, and prebaked at 90° C. for 60 seconds. Next, a polyimide, such as Amoco Polyimide 9120D, is spin coated with a speed of 2000 RPM. A final curing at 260° C. in nitrogen atmosphere for more than 3 hours is completed. Typical thickness of a resulting waveguide is 7 $\mu$m. Planar waveguides have also been fabricated on silicon substrate by inserting a high index polyimide layer (N=1.56 to 1.76) between 90/20D cladding layers.

Reflective elements 126 may comprise any suitable structure adaptable to provide efficient opto-electronic coupling, capable of co-fabrication with waveguide 116. Depending on desired performance and manufacturing parameters, mirror structures may be utilized. In a preferred embodiment, however, tilted waveguide gratings are employed to provide a 1 to 1 surface normal coupling. In this embodiment, both the waveguide(s) and the tilted gratings are polyimide based, to provide high temperature processing associated with silicon process fabrication. More specifically, the embodiment incorporates a titled grating profile in a planar structure within a thin waveguide layer upon which other micro-lithographically defined electrical interconnection layers can be built. Such a configuration requires the insertion of optical interconnect layer to be planarized. The tilted grating profile greatly enhances coupling efficiency in the desired direction. Such gratings may be fabricated with known micro-fabrication processes; rendering them mass-producible with excellent accuracy and reproducibility. As an example, such a grating coupler may be fabricated by reactive-ion-etching (RIE).

Referring again to FIG. 1, single-layer metal via structures 128 couple elements 122 and 124 to semiconductor devices 104 and 106, respectively; both devices being mounted at board surface 108. Use of vias 128 to provide direct coupling between the embedded opto-electronic elements and the board surface 108 provides the capability to utilize a variety of integrated circuit devices including a surface mount device, such as device 104, or standard pin mount device, such as device 106. Thus, integrated circuit devices may be mounted on the board using standard assembly and manufacturing processes. The presence of the opto-electronic components is realized only in higher performance; that presence otherwise being transparent to the user of the board.

Referring now to FIG. 2, system 200, an alternative embodiment of system 100, is shown in cross-sectional view. System 200 incorporates essentially the same elements within board 202 as does system 100. The only substantial difference in system 200 is that multi-layer vias 204 and 206 couple elements 122 and 124, respectively, to the board surface 208. This embodiment provides design flexibility and compatibility with a variety of fabrication processes.

The present invention thus provides an efficient opto-electronic signal communications system overcoming process incompatibilities previously associated with implementing optical components in high performance electronic systems. While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. For example, the optical signal communications system may be configured to provide a bus structure, comprising joint transmit and receive elements fabricated together at a single position on the waveguide. Further, the principles of the present invention are practicable in a number of process technologies. It is therefore intended that the appended claims encompass any such modifications or embodiments.

What is claimed is:

1. A printed circuit board having an embedded planarized signal communications system within, said planarized signal communications system comprising:

a first index buffer layer within said printed circuit board;

a second index buffer layer within said printed circuit board;

a polymer waveguide disposed below said first and above said second index buffer layers;

an electrical-to-optical transmitter disposed within said first index buffer layer, adjoining said polymer waveguide;

a reflective element disposed within said polymer waveguide in direct alignment with said electrical-to-optical transmitter, adapted to reflect optical energy from said electrical-to-optical transmitter along said polymer waveguide;

an optical-to-electrical receiver disposed within said first index buffer layer, adjoining said polymer waveguide;

a reflective element disposed within said polymer waveguide in direct alignment with said optical-to-electrical receiver, adapted to reflect optical energy from within said polymer waveguide to said optical-to-electrical receiver; and an at least partially metal layer within said printed circuit board, fabricated to provide electrical coupling between said electrical-to-optical transmitter and a surface of said printed circuit board, and between said optical-to-electrical receiver and said surface of the printed circuit board.

2. An opto-electronic signal communications system comprising:

a substrate having a first surface;

a waveguide structure fabricated within said substrate;

an electrical-to-optical transmitter fabricated within said substrate and in direct adjoinment with said waveguide structure;

a first reflective element fabricated within said waveguide structure in direct alignment with said electrical-to-optical transmitter;

an optical-to-electrical receiver fabricated within said substrate and in direct adjoinment with said waveguide structure;

a second reflective element fabricated within said waveguide structure in direct alignment with said optical-to-electrical receiver; and an at least partially metal layer within said substrate, fabricated to provide electrical coupling between said electrical-to-optical transmitter and said first surface, and between said optical-to-electrical receiver and said first surface.

3. A method of transceiving electrical signals through a substrate, said method comprising the steps of:

forming a waveguide structure within said substrate;

forming an electrical-to-optical transmitter within said substrate and in direct adjoinment with said waveguide structure;

forming a first reflective element within said waveguide structure in direct alignment with said electrical-to-optical transmitter;

forming an optical-to-electrical receiver within said substrate and in direct adjoinment with said waveguide structure;

forming a second reflective element within said waveguide structure in direct alignment with said optical-to-electrical receiver;

forming a first structure within said substrate to provide electrical coupling between said electrical-to-optical transmitter and a surface of said substrate, and a second structure within said substrate to provide electrical coupling between said optical-to-electrical receiver and said surface;

applying an electrical signal to said electrical-to-optical transmitter by said first structure; and receiving an electrical signal from said optical-to-electrical receiver by said second structure.

4. The printed circuit board recited in claim 1, wherein the electrical-to-optical transmitter comprises a laser.

5. The printed circuit board recited in claim 1, wherein the electrical-to-optical transmitter comprises a vertical cavity surface emitting laser.

6. The printed circuit board recited in claim 1, wherein the electrical-to-optical transmitter comprises an edge emitting laser.

7. The printed circuit board recited in claim 1, wherein the optical-to-electrical receiver comprises a silicon-based photodetector.

8. The printed circuit board recited in claim 1, wherein the polymer waveguide comprises a polyimide-based material.

9. The printed circuit board recited in claim 1, wherein the polymer waveguide has a thickness of about 7 microns.

10. The printed circuit board recited in claim 1, wherein the polymer waveguide has a refractive index above about 1.56.

11. The printed circuit board recited in claim 1, wherein the polymer waveguide has a refractive index of between about 1.56 and about 1.73.

12. The printed circuit board recited in claim 1, wherein the reflective element comprises a mirror.

13. The printed circuit board recited in claim 1, wherein the reflective element comprises a waveguide grating.

14. The printed circuit board recited in claim 13, wherein the waveguide grating comprises a polyimide material.

15. The printed circuit board recited in claim 1, wherein the reflective element provides a one-to-one surface normal coupling.

16. The opto-electronic system recited in claim 2, wherein the electrical-to-optical transmitter comprises a laser.

17. The opto-electronic system recited in claim 2, wherein the electrical-to-optical transmitter comprises a vertical cavity surface emitting laser.

18. The opto-electronic system recited in claim 2, wherein the electrical-to-optical transmitter comprises an edge emitting laser.

19. The opto-electronic system recited in claim 2, wherein the optical-to-electrical receiver comprises a silicon-based photodetector.

20. The opto-electronic system recited in claim 2, wherein the polymer waveguide comprises a polyimide-based material.

21. The opto-electronic system recited in claim 2, wherein the polymer waveguide has a thickness of about 7 microns.

22. The opto-electronic system recited in claim 2, wherein the polymer waveguide has a refractive index above about 1.56.

23. The opto-electronic system recited in claim 2, wherein the polymer waveguide has a refractive index of between about 1.56 and about 1.73.

24. The opto-electronic system recited in claim 2, wherein the first and second reflective elements each comprise a mirror.

25. The opto-electronic system recited in claim 2, wherein the first and second reflective elements each comprise a waveguide grating.

26. The printed circuit board recited in claim 25, wherein the waveguide gratings comprise a polyimide material.

27. The opto-electronic system recited in claim 2, wherein the first and second reflective elements provide a one-to-one surface normal coupling.

28. The method recited in claim 3, wherein the electrical-to-optical transmitter is fabricated by epitaxial lift off.

29. The method recited in claim 3, wherein the formation of the waveguide further comprises the steps of:

spin coating a primer layer on the substrate;

spin coating a layer of polyimide material on the primer layer;

curing the primer layer and the polyimide layer.

30. The method recited in claim 3, wherein the electrical-to-optical transmitter formed comprises a laser.

31. The method recited in claim 3, wherein the electrical-to-optical transmitter formed comprises a vertical cavity surface emitting laser.

32. The method recited in claim 3, wherein the electrical-to-optical transmitter formed comprises an edge emitting laser.

33. The method recited in claim 3, wherein the optical-to-electrical receiver formed comprises a silicon-based photodetector.

34. The method recited in claim 3, wherein the polymer waveguide formed comprises a polyimide-based material.

35. The method recited in claim 3, wherein the polymer waveguide formed has a thickness of about 7 microns.

36. The method recited in claim 3, wherein the polymer waveguide formed has a refractive index of above about 1.56.

37. The method recited in claim 3, wherein the polymer waveguide formed has a refractive index of between about 1.56 and about 1.73.

38. The method recited in claim 3, wherein the first and second reflective elements formed each comprise a mirror.

39. The method recited in claim 3, wherein the first and second reflective elements formed each comprise a waveguide grating.

40. The printed circuit board recited in claim 39, wherein the waveguide grating comprises a polyimide material.

41. The method recited in claim 3, wherein the first and second reflective elements formed provide a one-to-one surface normal coupling.

* * * * *